(12) United States Patent
Boettiger et al.

(10) Patent No.: US 6,465,141 B2
(45) Date of Patent: Oct. 15, 2002

(54) METHOD FOR IMPROVED LITHOGRAPHIC CRITICAL DIMENSION CONTROL

(75) Inventors: Ulrich C. Boettiger; Scott L. Light; Steve W. Bowes, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/000,040

(22) Filed: Dec. 4, 2001

(65) Prior Publication Data

US 2002/0041369 A1 Apr. 11, 2002

Related U.S. Application Data

(62) Division of application No. 09/642,019, filed on Aug. 21, 2000.

(51) Int. Cl.$^7$ .................................................. G03F 9/00
(52) U.S. Cl. ............................................ 430/30; 430/5
(58) Field of Search ........................................ 430/5, 30

(56) References Cited

U.S. PATENT DOCUMENTS

| | | | |
|---|---|---|---|
| 4,186,164 A | 1/1980 | Spivack | ........................ 264/81 |
| 5,986,742 A | 11/1999 | Straaijer et al. | ............... 355/53 |
| 6,021,009 A | 1/2000 | Borodovsky et al. | ........ 359/888 |

*Primary Examiner*—Christopher G. Young
(74) *Attorney, Agent, or Firm*—Dickstein Shapiro Morin & Oshinsky LLP

(57) ABSTRACT

A system and method for minimizing critical dimension errors on imaged wafers is described. After imaging and processing one or more wafers, the various critical dimensions are determined across the imaged exposure field and compared with the target critical dimensions to ascertain average critical dimension errors. The critical dimension error distribution across the field is modeled and the necessary exposure dose corrections are calculated to compensate the critical dimension errors. A pellicle is formed with light intensity modifying regions corresponding to the calculated local dose corrections. These regions alter the amount of light which is transmitted from a light source through a semiconductor mask onto the exposure fields of the wafers. As a consequence, the critical dimensions of the printed features are altered as well. The light intensity modifying region may be formed by depositing, such as by sputtering, particles which reflect or absorb light. Alternatively, the light intensity modifying region may be formed with an ink jet printer. Instead, a clear or grey-scaled pellicle may be used, and portions of it may be ablated to alter light transmission in certain areas.

16 Claims, 5 Drawing Sheets

METHOD FOR IMPROVED LITHOGRAPHIC CRITICAL DIMENSION CONTROL

This is a divisional application based upon U.S. patent application Ser. No. 09/642,019, filed on Aug. 21, 2000, which is hereby incorporated in its entirety by reference.

FIELD OF THE INVENTION

The invention generally relates to a system of and a method for fabricating semiconductor devices, and more particularly to a system, a device, and a method for improving lithographic critical dimension control.

BACKGROUND

With increasing sophistication and expertise in the fabrication of semiconductor devices, coupled with a demand for increasingly smaller die sizes, semiconductor device geometries, such as, for example, DRAM devices, are becoming smaller. An important limiting factor in decreasing semiconductor device geometries is accurate control of critical dimensions (CDs).

Errors in critical dimensions may be introduced to an exposure field on a wafer-in-process from reticle errors; from lithographic tools, such as dose nonuniformities or lens errors; from substrate variations causing systematic substrate reflectivity-induced errors, such as chemical-mechanical polishing dishing or doming or thin film deposition; and from systematic dry etch errors, such as process loading effects.

Another factor adding to the complexity of inhibiting critical dimension errors is that the transmission of light through a reticle may affect larger critical dimensions differently than smaller critical dimensions. Typically, smaller critical dimension features are more sensitive to the intensity level of light than larger critical dimension features.

Attempts have been made to address the issue of diminishing light intensity toward the edges of the exposure fields. See, for example, U.S. Pat. No. 6,021,009 (Borodovsky et al.). These attempts have been directed solely to making a more uniform transmission of light onto a wafer-in-process so that the light intensity experienced at the edge of the exposure field is similar to the light intensity experienced in the center of the exposure field.

There remains a need for a method of adjusting light intensity experienced across the exposure field of a wafer-in-process to accommodate varying sized critical dimensions due to long range mask critical dimension errors, systematic film thickness variations, and process loading effects, and for a device and system for locally adjusting the light intensity.

SUMMARY

The invention provides a system for diminishing longer ranging critical dimension errors across each exposure field experienced on a wafer. The system includes a light source, a semiconductor mask including a die image for imaging across an entire wafer, and a pellicle. The mask and the pellicle are positioned between the light source and the wafer. The pellicle includes a light intensity modifying region configured to regulate the transmission of light from the light source onto the wafer to create a non-uniform light transmission profile across the entire wafer exposure field and thereby reduce critical dimension errors thereon.

The invention further provides a pellicle for diminishing critical dimension errors on a wafer. The pellicle includes a light intensity modifying region which is configured to regulate the transmission of light from a light source onto the wafer to create systematically a non-uniform light transmission profile across the exposure field and thereby reduce critical dimension errors thereon.

The invention also provides a method for reducing critical dimension errors on a wafer. One or more wafers are imaged and processed through any steps that will affect critical dimensions on the wafer, such as film depositions, planarization, etch steps or cleans. Critical dimensions are then measured across the exposure fields of the processed wafer(s). By comparing several exposure fields, this data allows the calculation of an average critical dimension error for each measurement point in the exposure field, which represents the correctable systematic component of the total critical dimension error. Extrapolation between measurement points allows the modeling of the critical dimension error distribution for all points in the exposure field. To compensate these errors, the local exposure intensity is modulated across the exposure field by a customized pellicle with locally variable light transmission. The required local pellicle transmission changes can be calculated using a correlation curve relating exposure dose to the resulting critical dimension, which can be measured in a separate calibration experiment, and a suitable pellicle can be manufactured for critical dimension corrected imaging.

The foregoing and other advantages and features of the invention will be more readily understood from the following detailed description of preferred embodiments, which is provided in connection with the accompanying drawings.

DETAILED DESCRIPTION OF PREFERRED EMBODIMENTS

Figure 1:
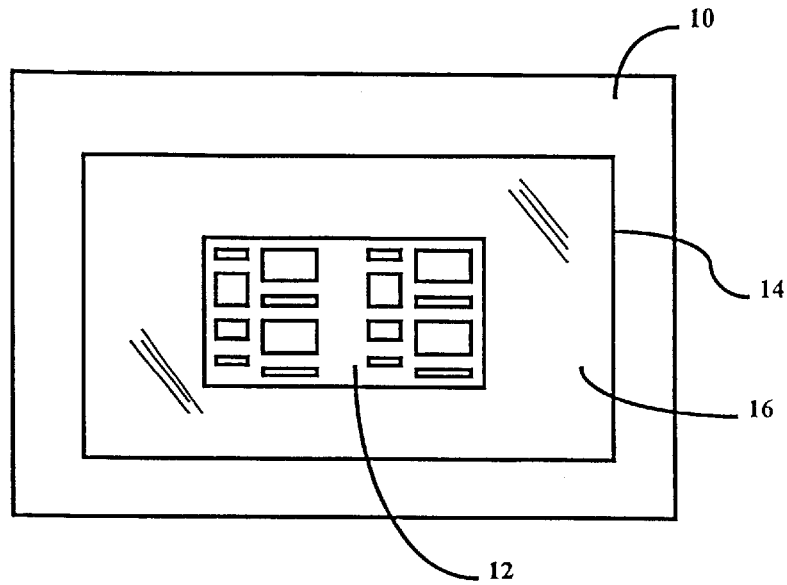
FIG. 1 is a view from the bottom of a conventional semiconductor mask.
Figure 2:
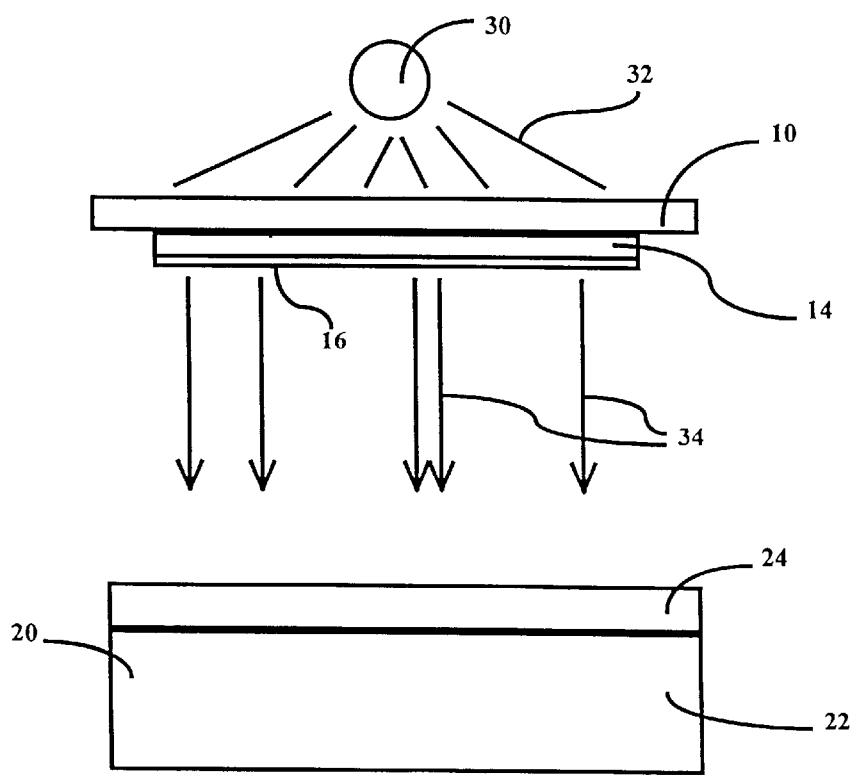
FIG. 2 is a side view of the semiconductor mask of FIG. 1.

FIGS. 1–2 illustrate a conventional semiconductor mask 10, such as a reticle. The mask 10 includes a die image 12, which is encapsulated by a surface of the mask 10, a frame 14 surrounding the die image 12, and an optionally included clear pellicle 16 positioned between the die image 12 and a wafer-in-process 20 during an exposure step. The pellicle 16 is mounted on an edge of the frame 14 farthest from the mask 10 to keep dust and other contaminants from the die image 12. The wafer-in-process 20 has a layer of photoresist material 24 overlying a substrate 22. The photoresist material 24 includes an exposure field 25 extending across the wafer-in-process 20.

In practice, light 32 from a light source 30 is transmitted onto and through the mask 10 and the pellicle 16. Some of the light is reflected by the die image 12, and the remaining non-reflected light 34 exposes portions of the photoresist material 24.

Figure 3:
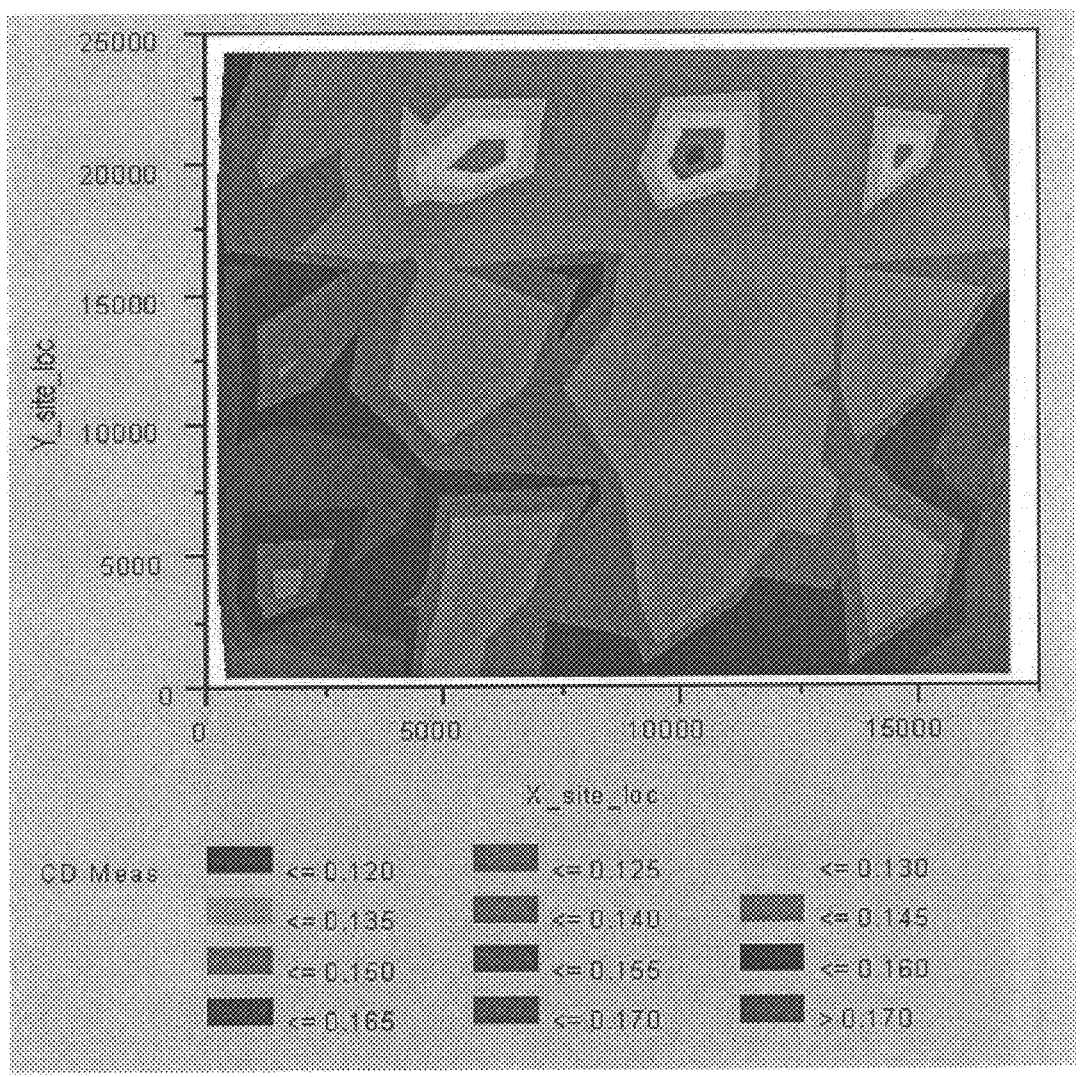
FIG. 3 is a contour plot of critical dimensions on the wafer-in-process of FIG. 1.

A wide continuum of critical dimensions may be obtained across a wafer exposure field, such as the photoresist material 24 of the wafer-in-process 20. With reference to FIG. 3, the photoresist material 24 which has been exposed through the mask 10, is shown in this contour plot illustrating a continuum of critical feature dimensions across the exposure field. As can be determined by the legend in FIG. 3, the critical dimensions have been determined to range from 0.12 microns to 0.17 microns and above. The reason for these feature size variations are errors in the printing process, introduced by various sources, which need to be compensated.

Suppose a critical dimension target in the FIG. 3 example is 0.15 microns across the entire exposure field. For CD corrected imaging, the overall exposure dose would then have to be enhanced to print even the areas with the biggest CDs at the smaller target value. This would cause the formerly smaller areas to print at even smaller CDs. In these areas, the pellicle transmission then needs to be reduced to lower the local dose and bring these features up to the target CD. The magnitude of the required local transmission changes can be calculated from an experimentally determined correlation curve, which relates the exposure dose to the size of the printed features. Based on such calculations, a pellicle with variable light transmission can be manufactured.

Figure 4:
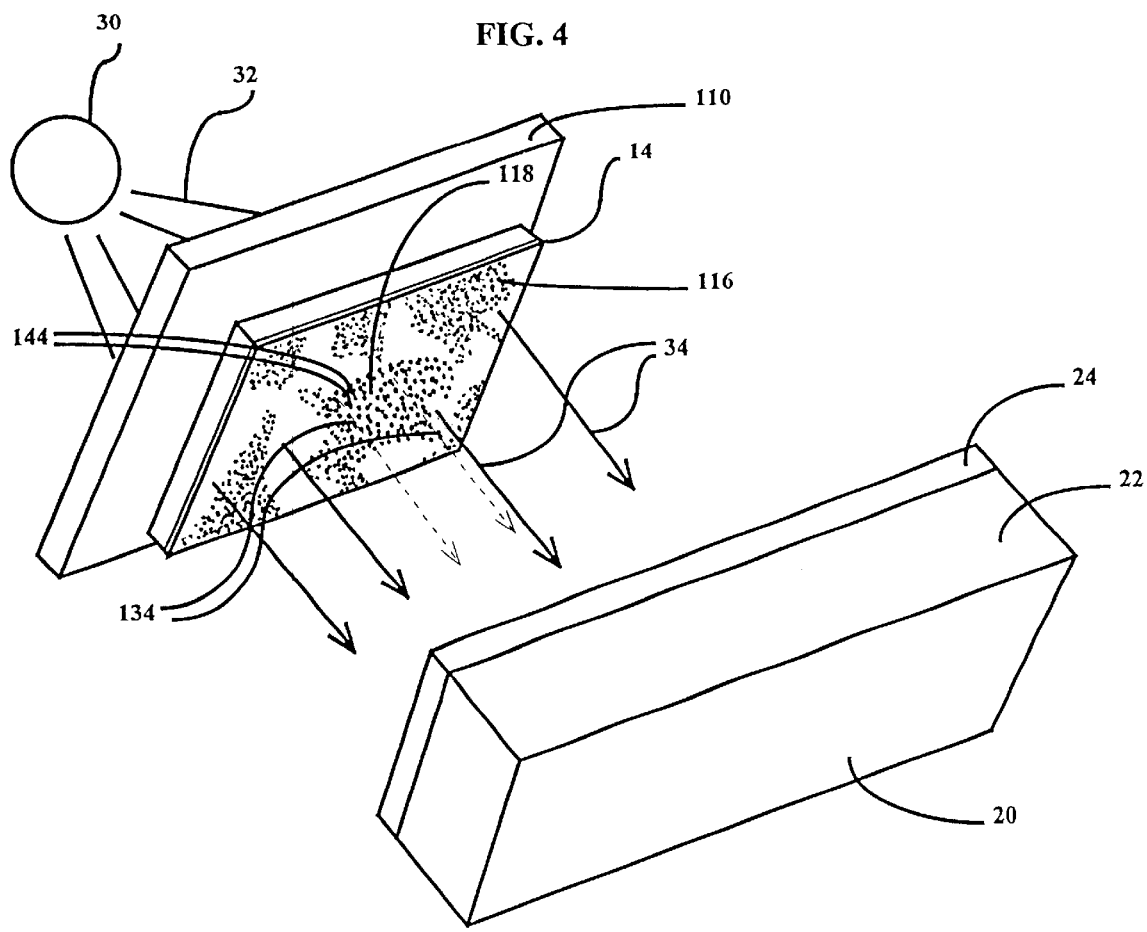
FIG. 4 is a perspective view of a semiconductor mask constructed in accordance with one embodiment of the invention.

FIG. 4 illustrates the use of a pellicle 116 in a semiconductor mask 110 constructed in accordance with a preferred embodiment of the invention. The mask 110 is essentially identical to the mask 10 with the exception of the form of the pellicle. The pellicle 116, unlike the pellicle 16, includes a light intensity modifying region 118, which may take up the entire extent of the pellicle 116 or some portion thereof. As illustrated, the light intensity modifying region 118 is made up of a plurality of light deflecting particles 144 which reflect or absorb some of the non-reflected light 34, creating an intensity change in the non-reflected light 34. The intensity change thereby modifies the critical dimensions across the exposure field of the wafer-in-process 20 according to the dose sensitivity of the photoresist 24 used. In this manner, the transmission of light profile across the exposure field of the wafer-in-process 20 is non-uniform, with more light intensity in areas requiring higher exposure dose and less light intensity in areas requiring a smaller exposure dose due to actual critical dimension errors found there.

Figure 5A:
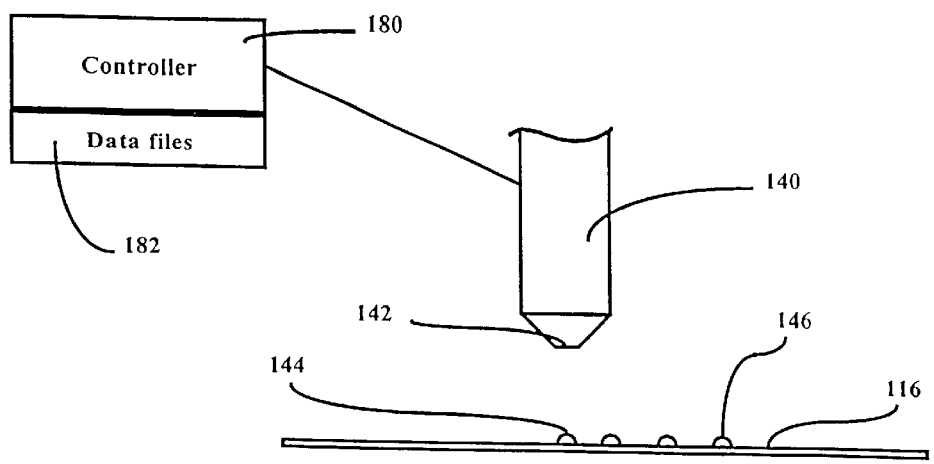
FIG. 5(A) is a side view illustrating the formation of the pellicle of FIG. 4 with a sputtering device in accordance with another embodiment of the invention.
Figure 5B:
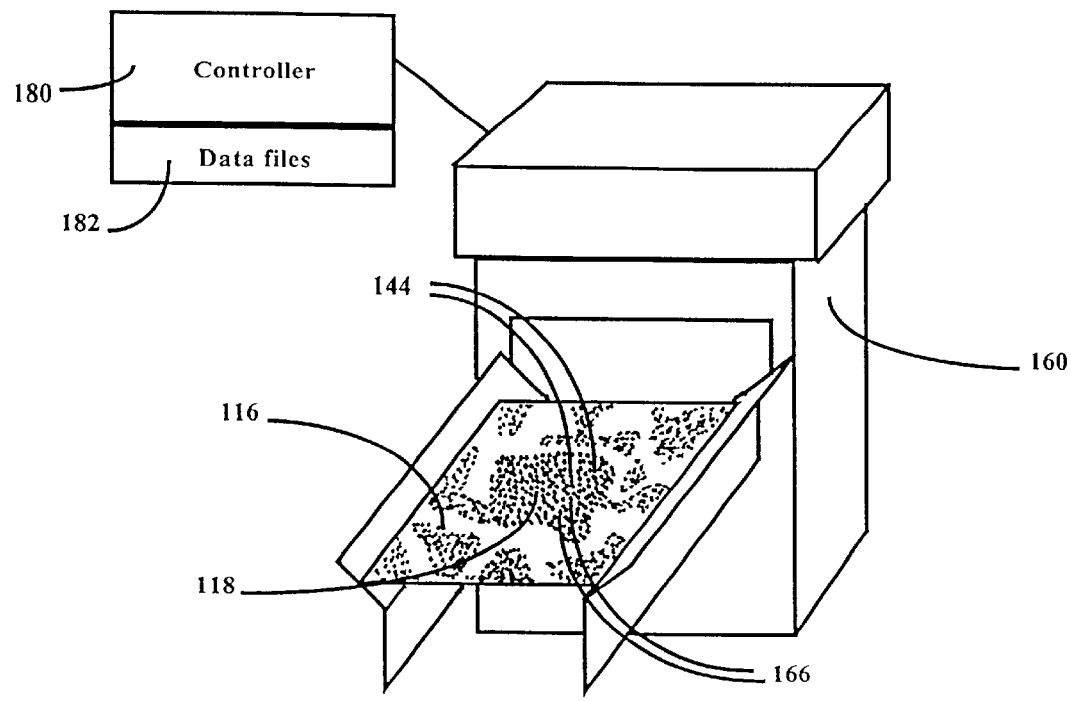
FIG. 5(B) is a perspective view of the formation of the pellicle of FIG. 4 using an ink jet printer in accordance with another embodiment of the invention.
Figure 5C:
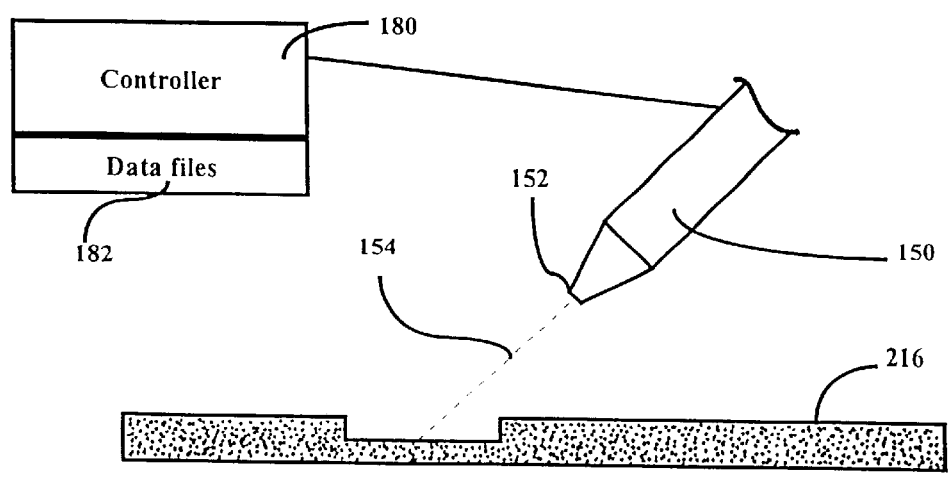
FIG. 5(C) is a side view of the formation of the pellicle of FIG. 4 with an excimer laser in accordance with another embodiment of the invention.

Pellicles having light intensity modifying regions 118 may be manufactured in one of a variety of ways. FIGS. 5(A)–5(C) illustrate some of the various modes of manufacture. Generally, pellicles are formed of a cellulose or other material, such as a polymide film. With specific reference to FIG. 5(A), the pellicle 116 is placed beneath a sputtering device 140 having a collimator 142. Light deflecting particles 144 are ejected from the collimator 142. Specifically, metallic particles 146 are sputtered across a surface of the pellicle 116, creating the light intensity modifying region 118.

A controller 180 is in electrical connection with the sputtering device 140. The controller 180 activates and deactivates the sputtering device 140 and controls the speed of the substrate movement to deposit a film with variable light transmission across the pellicle 116. Further, the controller 180 includes one or more data files 182 which contain data pertaining to critical dimension errors on the exposure field of the semiconductor wafers-in-process 20 and the sensitivity of the process steps to exposure dose changes. The data contained in the data files 182 is utilized by the controller 180 to control the movements and the ejections of the sputtering device 140 to create a pattern of sputtered particles in a configuration consistent with the light intensity modifying region 118.

Referring to FIG. 5(B), another mode of manufacturing a pellicle in accordance with an embodiment of the invention is illustrated. The light intensity modifying region 118 of the pellicle 116 may be formed with an ink jet printer 160. A special ink with an appropriate transmission level and exposure stability at the actinic wavelength may be necessary. The controller 180 controls the printer 160. Data from the data files 182 is used to create a pattern. The controller 180 controls the positioning of the jetting of the ink onto the pellicle 116 and the creation of printed particles 166, thereby creating the light intensity modifying region 118. Instead of the ink jet printer 160, a laser printer or other form of printer capable of depositing or otherwise forming the printed particle 166 on the pellicle 116 may be used.

Instead of depositing light reflecting particles, such as the metallic particles 146 or the printed particles 166, on a clear pellicle 116, a grey-scaled pellicle 216, as illustrated in FIG. 5(C), may be modified to create a similar light intensity modifying effect. The grey-scaled pellicle 216 has a fixed light transmission at the actinic wavelength. Through light absorption and/or interference effects, the thickness of the pellicle 216 determines the amount of light which may be transmitted through it. Part or all of the pellicle 216 may have its thickness tuned by ablation to create the desired transmission distribution. Specifically, the pellicle 216 may have its thickness lessened in various areas and to various depths in order to correlate specific light transmissivity with respective areas of the exposure field to alter the critical dimensions on the wafer-in-process 20 to desired critical dimensions. While the illustrated pellicle 216 is entirely grey-scaled, it is to be understood as within the scope of the invention that instead only a portion of the pellicle 216 may be grey-scaled. Further, a transparent pellicle may instead have its thickness tuned through ablation to modify its interference characteristics to control the amount of light which may be transmitted through it.

An excimer laser 150 may be utilized to create a pattern on the pellicle 216 to alter the light intensity across the pellicle 216 to diminish the variously sized critical dimension errors. The laser 150 includes an optical system 152, which allows precise control of its ultraviolet light emission to ablate portions from the pellicle, thereby diminishing the thickness of the pellicle 216 in certain areas. The controller 180 controls the actions of the laser 150, and the data files 182 are used to create an ablation pattern which is translated onto the pellicle 216 by the laser 150. By ablating certain portions of the pellicle 216, the intensity of light transmitted through the pellicle will vary consistent with the pellicle's absorption and interference properties.

Figure 6:
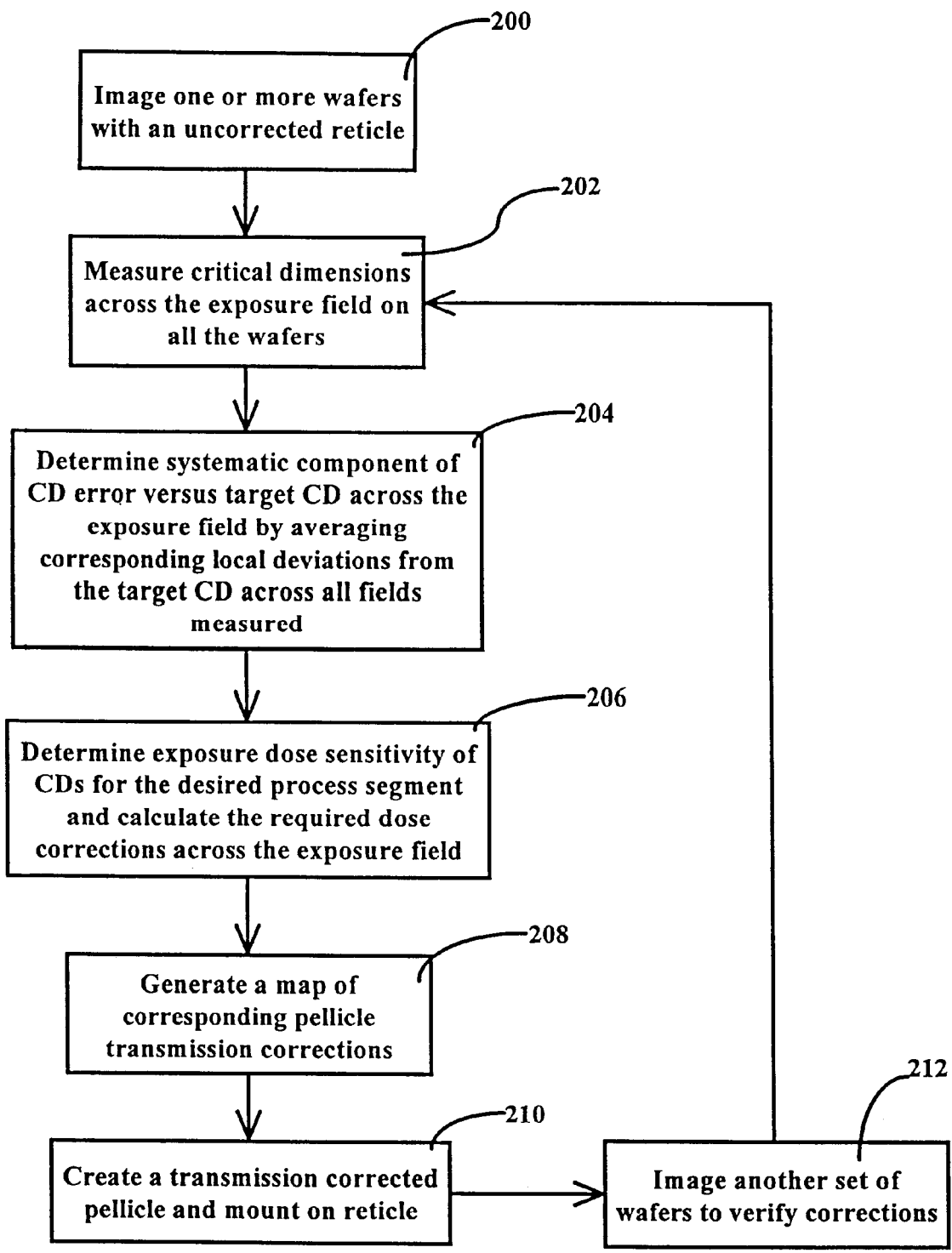
FIG. 6 is a flow diagram of the method of forming the pellicle of FIG. 4.

Next will be described a method of manufacturing a pellicle, such as the pellicle 116, 216, with reference to FIG. 6. At step 200, one or more wafers from a variety of wafer lots are imaged using an uncorrected semiconductor mask, such as the mask 10. The various critical dimensions are measured across the exposure fields on each of the wafers at step 202. These critical dimensions can be measured in either the resist pattern or after any relevant processing, such as etching or cleans. The measured critical dimensions are averaged at step 204 and compared with desired critical dimensions to determine average critical dimension errors across the exposure fields of the wafers. Extrapolation between measurement locations allows the calculation of the critical dimension error distribution across the exposure field. At step 206, a determination is made of the exposure dose sensitivity of the critical dimensions for the process segment of interest and the required dose corrections across the exposure field are calculated and stored in a data file. Based upon this data file containing the desired local transmission distribution, a map of corresponding pellicle transmission corrections is generated. Then, at step 210, a transmission corrected pellicle, such as the pellicle 116 or 216, is formed and mounted on the mask 10. To verify the corrections, at step 212 another set of wafers can be imaged, and steps 202 through 210 can be run over again.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, while the pellicle 116, 216 has been shown between the semiconductor mask 110 and the wafer-in-process 20, the pellicle 116, 216 could instead be placed between the light source 30 and the semiconductor mask 110. Accordingly, the invention is not to be seen as limited by the foregoing description, but is only limited by the scope of the appended claims.

What is claimed as new and desired to be protected by Letters Patent of the United States is:

1. A method for reducing critical dimension errors on a wafer, comprising:
    measuring critical dimensions on exposure fields of one or more imaged and processed wafers;
    modeling average critical dimension errors across the exposure fields;
    calculating transmission corrections based upon the modeled critical dimension errors;
    creating a light intensity modifying region on a pellicle based upon the contour map; and
    imaging the exposure fields using the created pellicle.

2. The method of claim 1, further comprising imaging at least one exposure field of a wafer prior to the measuring of critical dimensions.

3. The method of claim 1, wherein the modeling of average critical dimension errors comprises comparing average critical dimensions with desired critical dimensions.

4. The method of claim 1, wherein the modeling of average critical dimension errors comprises comparing average critical dimensions measured in a resist pattern.

5. The method of claim 1, wherein the modeling of average critical dimension errors comprises comparing average critical dimensions measured after one or more pattern transfer steps on the wafer.

6. The method of claim 1, wherein the creating of a light intensity modifying region comprises depositing light deflecting particles on the pellicle.

7. The method of claim 6, wherein the depositing of light deflecting particles comprises sputtering metallic particles on the pellicle.

8. The method of claim 6, wherein the depositing of light reflecting particles comprises printing particles on the pellicle.

9. The method of claim 8, wherein the printing of particles comprises using an ink jet printer.

10. The method of claim 1, wherein the creating of the light intensity modifying region comprises altering the thickness of the pellicle at certain locations.

11. The method of claim 10, wherein the altering of the thickness of the pellicle comprises ablating portions of the pellicle.

12. The method of claim 11, wherein the pellicle is entirely grey-scaled.

13. The method of claim 11, wherein the ablating comprises using an excimer laser.

14. The method of claim 1, wherein the imaging of the exposure field comprises transmitting a light from a light source through a semiconductor mask and the pellicle onto the exposure field of the wafer.

15. The method of claim 14, wherein the imaging of the exposure field comprises positioning the pellicle between the light source and the semiconductor mask.

16. The method of claim 14, wherein the imaging of the exposure field comprises positioning the semiconductor mask between the light source and the pellicle.

* * * * *